(12) United States Patent
Kobayashi

(10) Patent No.: US 7,375,601 B2
(45) Date of Patent: May 20, 2008

(54) DUAL-BAND OSCILLATOR

(75) Inventor: Hiroki Kobayashi, Fukushima-ken (JP)

(73) Assignee: Alps Electric Co., Ltd, Tokyo (JP)

( * ) Notice: Subject to any disclaimer, the term of this patent is extended or adjusted under 35 U.S.C. 154(b) by 82 days.

(21) Appl. No.: 11/389,413

(22) Filed: Mar. 23, 2006

(65) Prior Publication Data
US 2006/0255873 A1    Nov. 16, 2006

(30) Foreign Application Priority Data
May 13, 2005    (JP)    ............................. 2005-141454

(51) Int. Cl.
*H03B 5/12* (2006.01)
(52) U.S. Cl. .......................... 331/179; 331/46; 331/49; 331/117 R
(58) Field of Classification Search ................ 331/179, 331/49, 46, 117 R
See application file for complete search history.

(56) References Cited
U.S. PATENT DOCUMENTS

| | | | |
|---|---|---|---|
| 6,288,615 B1 * | 9/2001 | Kobayashi | .................... 331/49 |
| 6,501,338 B2 * | 12/2002 | Nakano et al. | ................ 331/48 |
| 6,590,465 B2 | 7/2003 | Ikarashi | |
| 6,894,573 B2 * | 5/2005 | Eckl et al. | ............... 331/117 R |
| 7,042,297 B2 * | 5/2006 | Kawagishi et al. | ........... 331/49 |

FOREIGN PATENT DOCUMENTS

JP    2003-60433    2/2003

* cited by examiner

*Primary Examiner*—Benny Lee
*Assistant Examiner*—Levi Gannon
(74) *Attorney, Agent, or Firm*—Beyer Law Group LLP

(57) ABSTRACT

When two oscillation signals are output from a common terminal through switching, to reduce attenuation of the oscillation signals, a dual-band oscillator includes a first oscillating transistor for generating an oscillation signal in a first frequency band; a first inductor for supplying power to a collector of the first oscillating transistor; a first switching element for switching the first oscillating transistor; a second oscillating transistor for generating an oscillation signal in a second frequency band; a second inductor for supplying power to a collector of the second oscillating transistor; a second switching element for switching the second oscillating transistor; and an output terminal for outputting the oscillation signal in the first frequency band or in the second frequency band. The first switching element is disposed between the first inductor and the output terminal, and the second switching element is disposed between the second inductor and the output terminal.

6 Claims, 2 Drawing Sheets

DUAL-BAND OSCILLATOR

BACKGROUND OF THE INVENTION

1. Field of the Invention

The present invention relates to a dual-band oscillator that is capable of selectively outputting either one of oscillation signals in two frequency bands.

2. Description of the Related Art

Referring to FIG. 3, a dual-band voltage-controlled oscillator that is used for PCS (Personal Communications Services, i.e., cellular phones operating in the 1900 MHz band) and DCS (Digital Cellular System, i.e., cellular phones operating in the 1800 MHz band) includes a VCO circuit 10 for PCS and a VCO circuit 20 for DCS. These two VCO circuits 10 and 20 are configured substantially the same.

Each of the VCO circuit 10 for PCS and the VCO circuit 20 for DCS includes digital transistors DTr-1 and DTr-2. The base of the digital transistor DTr-1 is connected to the collector of the digital transistor DTr-2, and a switching terminal $V_{SW}$ is connected to the base of the digital transistor DTr-2. Thus, when a negative switching voltage is applied to the switching terminal $V_{SW}$, whereby the digital transistor DTr-2 is turned on, a power-supply voltage from a power-supply voltage terminal (Vcc) causes a bias voltage to be applied to a transistor Tr-2 for oscillation and buffering of the VCO circuit 20 for DCS, whereby the VCO circuit 20 for DCS operates in the 1800 MHz frequency band.

At this time, a positive voltage is applied to the base of the digital transistor DTr-1. Thus, the digital transistor DTr-1 is turned off, so that the VCO circuit 10 for PCS, configured to operate in the 1900 MHz band, does not cause oscillation. In contrast, when a positive switching voltage is applied to the switching terminal $V_{SW}$, the digital transistor DTr-2 is turned off, so that the VCO circuit 20 for DCS, configured to operate in the 1800 MHz band, does not cause oscillation. However, since a negative voltage is applied to the collector of the digital transistor DTr-2, the negative voltage is applied directly to the base of the digital transistor DTr-1. Thus, the power-supply voltage from the power-supply voltage terminal (Vcc) causes a bias voltage to be applied to a transistor Tr-1 for oscillation and buffering of the VCO circuit 10 for PCS, so that the VCO circuit 10 for PCS operates in the 1900 MHz frequency band.

In the configuration according to the related art described above, oscillation signals are output from output terminals RFout-1 and RFout-2 of the respective VCO circuits 10 and 20. When these two output terminals are connected to each other to form a common output terminal, the levels of the oscillation signals output are attenuated.

SUMMARY OF THE INVENTION

In view of the situation described above, it is an object of the present invention to reduce attenuation of oscillation signals when two oscillation signals are output from a common terminal by switching.

In a first arrangement according to the present invention, a dual-band oscillator includes a first oscillating transistor for generating an oscillation signal in a first frequency band from a collector thereof; a first inductor for supplying electric power to the collector of the first oscillating transistor; a first switching element for switching the first oscillating transistor between an active state and an inactive state; a second oscillating transistor for generating an oscillation signal in a second frequency band from a collector thereof; a second inductor for supplying electric power to the collector of the second oscillating transistor; a second switching element for switching the second oscillating transistor between an active state and an inactive state; and an output terminal for outputting the oscillation signal in the first frequency band or the oscillation signal in the second frequency band to outside of the dual-band oscillator. The first switching element is disposed between the first inductor and the output terminal, and the second switching element is disposed between the second inductor and the output terminal.

In a second arrangement according to the present invention, the collector of the first oscillating transistor is directly connected to the first inductor, electric power is supplied to a base of the first oscillating transistor via the first switching element, the collector of the second oscillating transistor is directly connected to the second inductor, and electric power is supplied to a base of the second oscillating transistor via the second switching element.

In a third arrangement according to the present invention, electric power is supplied to the collector and a base of the first oscillating transistor via the first switching element, and electric power is supplied to the collector and a base of the second oscillating transistor via the second switching element.

In a fourth arrangement according to the present invention, the first inductor is implemented by a first strip line having a length corresponding to a quarter of a wavelength of the oscillation signal in the first frequency band, and the second inductor is implemented by a second strip line having a length corresponding to a quarter of the oscillation signal in the second frequency band.

In a fifth arrangement according to the present invention, each of the first switching element and the second switching element is implemented by a transistor.

According to the first arrangement, a dual-band oscillator includes a first oscillating transistor for generating an oscillation signal in a first frequency band from a collector thereof; a first inductor for supplying electric power to the collector of the first oscillating transistor; a first switching element for switching the first oscillating transistor between an active state and an inactive state; a second oscillating transistor for generating an oscillation signal in a second frequency band from a collector thereof; a second inductor for supplying electric power to the collector of the second oscillating transistor; a second switching element for switching the second oscillating transistor between an active state and an inactive state; and an output terminal for outputting the oscillation signal in the first frequency band or the oscillation signal in the second frequency band to outside of the dual-band oscillator, and the first switching element is disposed between the first inductor and the output terminal, and the second switching element is disposed between the second inductor and the output terminal. Thus, an oscillation signal output from one oscillating transistor is not attenuated by an inductor connected to the collector of the other oscillating transistor.

According to the second arrangement, the collector of the first oscillating transistor is directly connected to the first inductor, electric power is supplied to a base of the first oscillating transistor via the first switching element, the collector of the second oscillating transistor is directly connected to the second inductor, and electric power is supplied to a base of the second oscillating transistor via the second switching element. Thus, the individual oscillating transistors can be turned on or off according to voltages applied to the bases of the individual oscillating transistors.

According to the third arrangement, electric power is supplied to the collector and a base of the first oscillating transistor via the first switching element, and electric power is supplied to the collector and a base of the second oscillating transistor via the second switching element. Thus, the individual oscillating transistors can be turned on or off according to voltages applied to the collectors and bases of the individual oscillating transistors.

According to the fourth arrangement, the first inductor is implemented by a first strip line having a length corresponding to a quarter of a wavelength of the oscillation signal in the first frequency band, and the second inductor is implemented by a second strip line having a length corresponding to a quarter of the oscillation signal in the second frequency band. Thus, oscillation signals output from the collectors of the first and second oscillating transistors are not attenuated.

According to the fifth arrangement, each of the first switching element and the second switching element is implemented by a transistor. Thus, the individual switching elements can be readily controlled according to voltages applied to the bases thereof.

DESCRIPTION OF THE PREFERRED EMBODIMENTS

Figure 1:
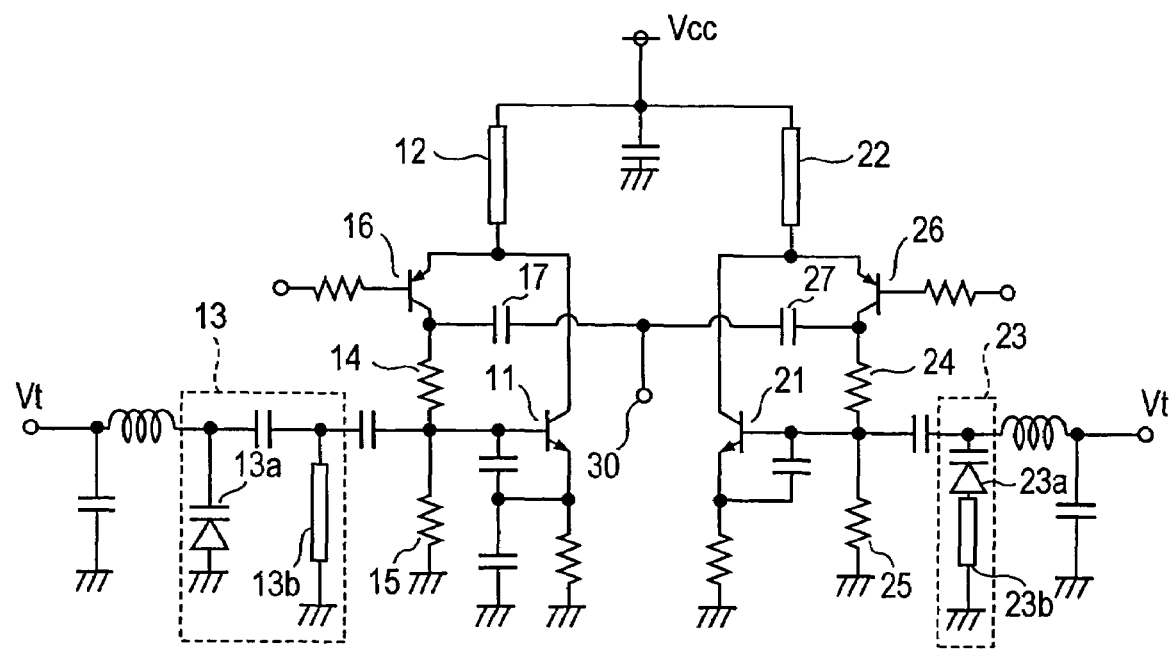
FIG. 1 is a circuit diagram showing the configuration of a dual-band oscillator according to a first embodiment of the present invention.

FIG. 1 shows a first embodiment of the present invention. Referring to FIG. 1, a first oscillating transistor 11 (NPN type) oscillates in a first frequency band (approximately 1.8 GHz band). The collector of the first oscillating transistor 11 receives electric power from a power-supply terminal Vcc via a first inductor 12. The first inductor 12 is implemented by a strip line having a length corresponding to approximately a quarter of the wavelength of an oscillation signal in the first frequency band. The base of the first oscillating transistor 11 is coupled to a first resonant circuit 13. The first resonant circuit 13 includes a varactor diode 13a and a resonant line 13b, and a control voltage Vt is applied to the varactor diode 13a. A bias voltage is applied to the base of the first oscillating transistor 11 by resistors 14 and 15. The resistor 14 on the power-supply side is connected to the first inductor 12 via a first switching element 16. The first switching element 16 is implemented by a transistor (PNP type) with the emitter thereof connected to the first inductor 12 and the collector thereof connected to the resistor 14.

A second oscillating transistor 21 (NPN type) oscillates in a second frequency band (approximately 3.6 GHz band). The collector of the second oscillating transistor 21 receives electric power from the power-supply terminal Vcc via a second inductor 22. The second inductor 22 is implemented by a strip line having a length corresponding to approximately a quarter of the wavelength of an oscillation signal in the second frequency band. In contrast, the length of the first inductor 12 corresponds to half the wavelength of an oscillation signal in the second frequency band. The base of the second oscillating transistor 21 is coupled to a second resonant circuit 23. The second resonant circuit 23 includes a varactor diode 23a and a resonant line 23b, and the control voltage Vt is applied to the varactor diode 23a. A bias voltage is applied to the base of the second oscillating transistor 21 by resistors 24 and 25. The resistor 24 on the power-supply side is connected to the second inductor 22 via a second switching element 26. The second switching element 26 is implemented by a transistor (PNP type) with the emitter thereof connected to the second inductor 22 and the collector thereof connected to the resistor 24.

An output terminal 30 outputs an oscillation signal in the first frequency band or an oscillation signal in the second frequency band. For this purpose, the first switching element 16 is coupled to the output terminal 30 via a first capacitor 17, and the second switching element 26 is coupled to the output terminal 30 via a second capacitor 27. The switching of output is controlled by the first switching element 16 and the second switching element 26.

When an oscillation signal in the first frequency band is to be output, a low voltage is applied to the base of the first switching element 16, whereby the first switching element 16 is turned on. Furthermore, a bias voltage is applied to the base of the first oscillating transistor 11, whereby the first oscillating transistor 11 oscillates in the first frequency band. The second switching element 26 is kept in the turned off state. An oscillation signal output from the collector of the first oscillating transistor 11 is output to the output terminal 30 via the first switching element 16 and the first capacitor 17. At this time, since the second switching element 26 is kept in the turned off state, the oscillation signal is not transmitted toward the second inductor 22 or the collector of the second oscillating transistor 21, so that loss of the oscillation signal does not occur.

Similarly, when an oscillation signal in the second frequency band is to be output, a low voltage is applied to the base of the second switching element 26, whereby the second switching element 26 is turned on. Furthermore, a bias voltage is applied to the base of the second oscillating transistor 21, whereby the second oscillating transistor 21 oscillates in the second frequency band. The first switching element 16 is kept in the turned off state. An oscillation signal output from the collector of the second oscillating transistor 21 is output to the output terminal 30 via the second switching element 26 and the second capacitor 27. At this time, although the strip line serving as the first inductor 12 has a length corresponding to half the wavelength of the oscillation signal in the second frequency band, since the first switching element 16 is turned off, the oscillation signal is not transmitted toward the inductor 12 or the collector of the first oscillating transistor 11, so that loss of the oscillation signal does not occur.

Figure 2:
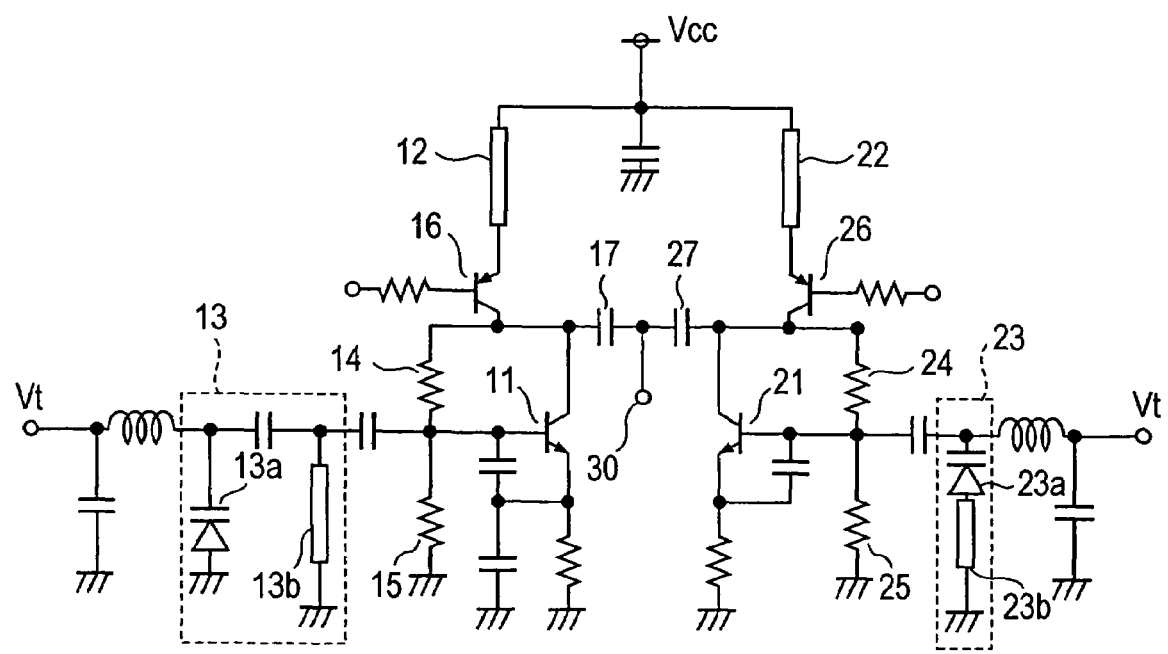
FIG. 2 is a circuit diagram showing the configuration of a dual-band oscillator according to a second embodiment of the present invention.
Figure 3:
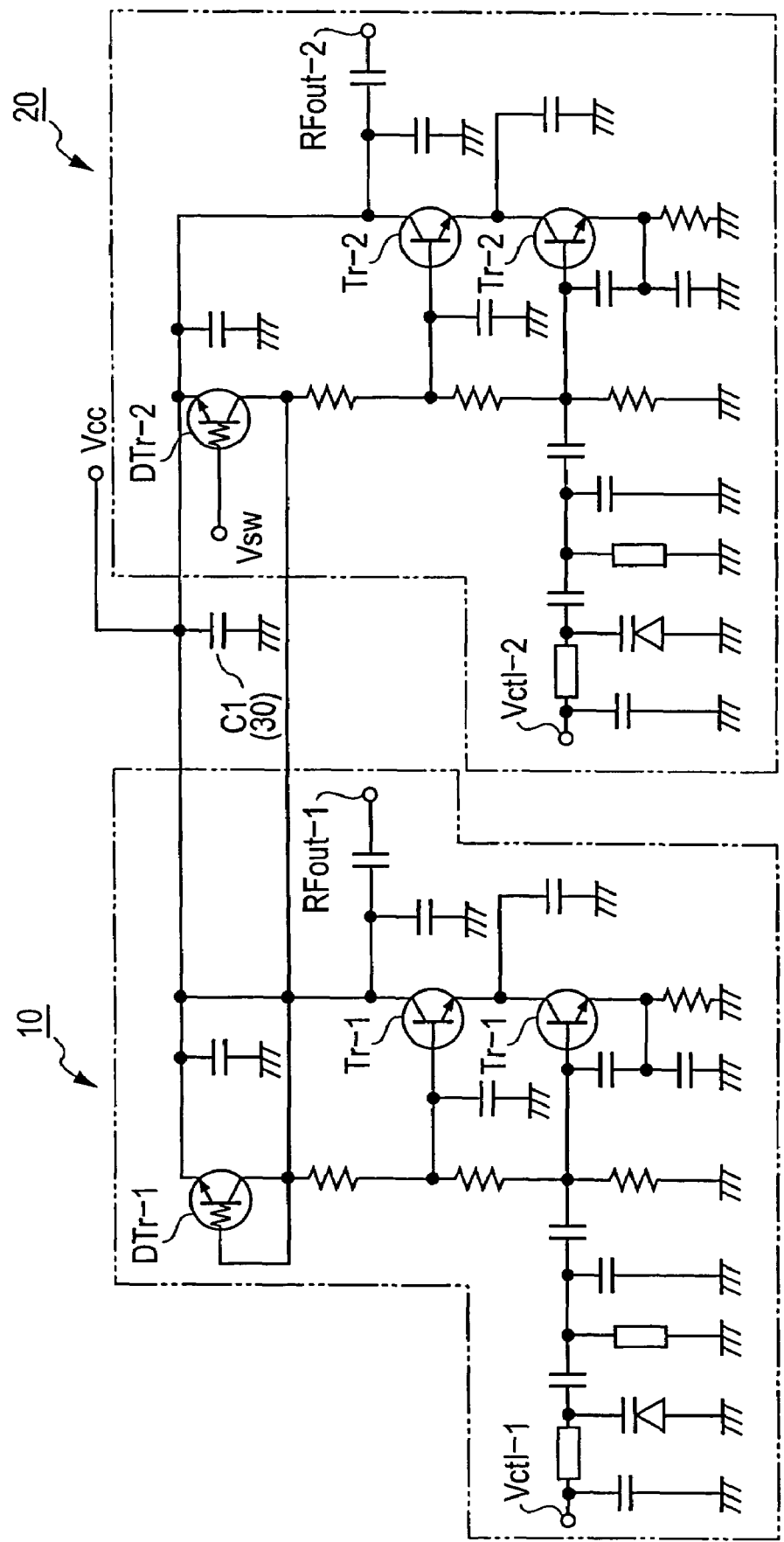
FIG. 3 is a circuit diagram showing the configuration of a dual-band oscillator according to the related art.

Referring next to FIG. 2, in a second embodiment of the present invention, as opposed to the first embodiment shown in FIG. 1, instead of the collector of the first oscillating transistor 11 being directly connected to the first inductor 12, the collector of the first oscillating transistor 11 is connected to a node between the first switching element 16 and the resistor 14. Similarly, instead of the collector of the second oscillating transistor 21 being directly connected to the second inductor 22, the collector of the second oscillating transistor 21 is connected to a node between the second switching element 26 and the resistor 24. That is, the collector of the first oscillating transistor 11 is connected to the first inductor 12 via the first switching element 16, and the collector of the second oscillating transistor 21 is connected to the second inductor 22 via the second switching element 26. The configuration is otherwise the same as the configuration shown in FIG. 1.

Also in the configuration shown in FIG. 2, when an oscillation signal in the first frequency band is to be output, a low voltage is applied to the base of the first switching element 16, whereby the first switching element 16 is turned on. Furthermore, a voltage is applied from the first inductor 12 to the collector and base of the first oscillating transistor 11, whereby the first oscillating transistor 11 oscillates in the first frequency band. The second switching element 26 is kept in the turned off state. An oscillation signal output from the collector of the first oscillating transistor 11 is output to the output terminal 30 via the first capacitor 17. At this time, since the second switching element 26 is kept in the turned off state, the oscillation signal is not transmitted toward the second inductor 22, so that loss of the oscillation signal does not occur.

Similarly, when an oscillation signal in the second frequency band is to be output, a low voltage is applied to the base of the second switching element 26, whereby the second switching element 26 is turned on. Furthermore, a voltage is applied from the second inductor 22 to the collector and base of the second oscillating transistor 21, whereby the second oscillating transistor 21 oscillates in the second frequency band. The first switching element 16 is kept in the turned off state. An oscillation signal output from the collector of the second oscillating transistor 21 is output to the output terminal 30 via the second capacitor 27. At this time, although the first inductor 12 has a length corresponding to half the wavelength of the oscillation signal in the second frequency band, since the first switching element 16 is kept in the turned off state, the oscillation signal is not transmitted toward the first inductor 12, so that loss of the oscillation signal does not occur.

What is claimed is:

1. A dual-band oscillator comprising:
    a first oscillating transistor for generating an oscillation signal in a first frequency band from a collector thereof;
    a first inductor for supplying electric power to the collector of the first oscillating transistor;
    a first switching element for switching the first oscillating transistor between an active state and an inactive state;
    a second oscillating transistor for generating an oscillation signal in a second frequency band from a collector thereof;
    a second inductor for supplying electric power to the collector of the second oscillating transistor;
    a second switching element for switching the second oscillating transistor between an active state and an inactive state; and
    an output terminal for outputting the oscillation signal in the first frequency band or the oscillation signal in the second frequency band to outside of the dual-band oscillator;
    wherein the first switching element is disposed between the first inductor and the output terminal, and the second switching element is disposed between the second inductor and the output terminal; and
    wherein the collector of the first oscillating transistor is directly connected to the first inductor, electric power is supplied to a base of the first oscillating transistor via the first switching element, the collector of the second oscillating transistor is directly connected to the second inductor, and electric power is supplied to a base of the second oscillating transistor via the second switching element.

2. The dual-band oscillator according to claim 1, wherein the first inductor is implemented by a first strip line having a length corresponding to a quarter of a wavelength of the oscillation signal in the first frequency band, and the second inductor is implemented by a second strip line having a length corresponding to a quarter of the oscillation signal in the second frequency band.

3. The dual-band oscillator according to claim 1, wherein each of the first switching element and the second switching element is implemented by a transistor.

4. A dual-band oscillator comprising:
    a first oscillating transistor for generating an oscillation signal in a first frequency band from a collector thereof;
    a first inductor for supplying electric power to the collector of the first oscillating transistor;
    a first switching element for switching the first oscillating transistor between an active state and an inactive state;
    a second oscillating transistor for generating an oscillation signal in a second frequency band from a collector thereof;
    a second inductor for supplying electric power to the collector of the second oscillating transistor;
    a second switching element for switching the second oscillating transistor between an active state and an inactive state; and
    an output terminal for outputting the oscillation signal in the first frequency band or the oscillation signal in the second frequency band to outside of the dual-band oscillator;
    wherein the first switching element is disposed between the first inductor and the output terminal, and the second switching element is disposed between the second inductor and the output terminal; and
    wherein electric power is supplied to the collector and a base of the first oscillating transistor via the first switching element, and electric power is supplied to the collector and a base of the second oscillating transistor via the second switching element.

5. The dual-band oscillator according to claim 4, wherein the first inductor is implemented by a first strip line having a length corresponding to a quarter of a wavelength of the oscillation signal in the first frequency band, and the second inductor is implemented by a second strip line having a length corresponding to a quarter of the oscillation signal in the second frequency band.

6. The dual-band oscillator according to claim 4, wherein each of the first switching element and the second switching element is implemented by a transistor.

* * * * *